United States Patent [19]

Rauner et al.

[11] Patent Number: 4,985,859
[45] Date of Patent: Jan. 15, 1991

[54] METHOD FOR IDENTIFYING AND INTERROGATING THE MEASURED VALUE OF THE VELOCITY OR SPEED OF AN OBJECT

[75] Inventors: Hans Rauner, Nittenau; Erwin Grauvogl, Sinzing; Gerhard Gerl, Regensburg; Josef Forster, Woerth/Donau, all of Fed. Rep. of Germany

[73] Assignee: Siemens Aktiengesellschaft, Berlin and Munich, Fed. Rep. of Germany

[21] Appl. No.: 433,954

[22] Filed: Nov. 9, 1989

[30] Foreign Application Priority Data

Nov. 11, 1988 [EP] European Pat. Off. ......... 88118880.9

[51] Int. Cl.[5] .................. G01P 3/48; G01R 23/02
[52] U.S. Cl. ............................. 364/565; 377/20; 377/44; 324/166
[58] Field of Search ............... 377/20, 44; 364/565; 324/166

[56] References Cited

U.S. PATENT DOCUMENTS

| | | | |
|---|---|---|---|
| 3,567,913 | 3/1971 | Webb | 377/20 |
| 4,485,452 | 11/1984 | Cording et al. | 364/565 |
| 4,575,865 | 3/1986 | Dackow | 377/20 |
| 4,584,528 | 4/1986 | Ohmae et al. | 377/20 |
| 4,672,556 | 6/1987 | Shepler | 377/20 |
| 4,794,551 | 12/1988 | Yoshida | 324/166 |
| 4,839,834 | 6/1989 | Omae et al. | 364/565 |

OTHER PUBLICATIONS

IEEE Transactions on Industrial Electronics, vol. IE-30, (1983), Nov., No. 4—Chaudhuri et al., "Wide-Range Precision Speed Measurement with Adaptive Optimization Using a Microcomputer", pp. 369–373.

*Primary Examiner*—John S. Heyman
*Attorney, Agent, or Firm*—Hill, Van Santen, Steadman & Simpson

[57] ABSTRACT

A method for identifying a measured value of a velocity or speed of an object where a measured value call-in can occur at any time. A chronological spacing of measuring pulses of a speed sensor is measured and a measured value is formed therefrom. The measurement is carried out until either a measured value call-in occurs, a maximum number of measuring pulses is registered, or a maximum measuring duration is exceeded. When no measuring pulse or only one measuring pulse is registered, a distinction is made in the formation of the measured value as to whether a measuring duration corresponding to a minimum velocity or minimum speed is upwardly or downwardly crossed. An initial counter reading is stored at every measuring start and at every first registered measured pulse. A final counter reading is stored at every further registered measuring pulse until either a measured value call-in occurs or the maximum measuring duration is exceeded. The time interval lying between the initial counter reading and the final counter reading forms the basis for the calculation of the measured value.

11 Claims, 3 Drawing Sheets

METHOD FOR IDENTIFYING AND INTERROGATING THE MEASURED VALUE OF THE VELOCITY OR SPEED OF AN OBJECT

BACKGROUND OF THE INVENTION

The invention is directed to a method for identifying and interrogating a measured value of velocity or speed of an object, particularly of the circumferential speed of a vehicle wheel.

In an apparatus of this type disclosed by EP-B-0 059 433, which is equivalent to U.S. Pat. No. 4,584,528 issued Apr. 22, 1986 to Ohmac et al, incorporated herein by reference, the measurement interval extends beyond a prescribed minimum interval, so that the identification of a new measured value is never possible until after the expiration of this minimum interval. Such a measuring method is therefore only useful within certain limits since measured values may be called in at irregular time intervals that can also be shorter than the minimum interval. This occurs, for example, in control systems for propulsion or braking.

It is also not possible in the known case to reliably identify the stand-still of a vehicle since measuring pulses are fundamentally required for the identification of a new measured value, but such measuring pulses are not generated given stand-still of a vehicle.

SUMMARY OF THE INVENTION

It is an object of the invention to improve the method of the type initially cited such that call-ins of measured values occurring at arbitrary times can be answered with a measured value.

According to the method of the invention for identifying and interrogating a measured value M of velocity or speed of an object, upon arrival of every measuring pulse and at every initialization instruction, a counter reading z of the clock counter is read and allocated to a respective triggering event. A counter reading z allocated to the initialization instruction and to a first, following measuring pulse as an initial value za (said initial value za being an initial value of a measuring interval and of an interrogation interval that begins therewith) is stored. A counter reading z allocated to every following measuring pulse as a final value ze is stored, whereby every new counter reading overrides a preceding counter reading. For a measured value call-in, the measuring interval with the last measuring pulse is entered; a difference between the final value ze and the initial value za is used as the clock pulse sum St; and the final value ze is stored as a new initial value za if the measuring pulse sum Si is greater than 1 and less than a maximum value Simax.

With the invention, the chronological value in the form of a counter reading of a clock counter is essentially allocated to every measuring pulse, so that a new value of the measured value can already be calculated after two measuring pulses. The duration of a measuring interval is thus defined by the last measuring pulse before a call-in of a measured value and, in contrast to the prior art, is thus variable.

Also, in accordance with the invention, a measured value can even be called in when no measuring pulse or only one measuring pulse has arrived since the last call-in of the measured value. For this purpose, the duration of the interrogation interval is compared to that of a limit interval that corresponds to the distance between two measuring pulses at the lowest limit velocity coming into consideration. When the duration of the interrogation interval is therefore longer than this limit interval and when no measuring pulse or only one measuring pulse lies in the interrogation interval, then the velocity is equal to or less than the limit velocity. In this case, zero is output as a new value. Depending upon the requirements, the limit velocity can also be output as a new value.

When, by contrast, the duration of the interrogation interval is shorter than the limit interval given a measured value call-in, and when no re-calculation is possible on the basis of stored final and initial values, then the old value calculated at the most recent call-in of a measured value is output, and the measurement is continued. The difference between the counter reading of the clock counter at the point in time of the call-in of a measured value and the stored initial value even makes it possible to indicate that the velocity must be lower than the velocity that corresponds to the quotient of the path interval between two teeth of the sensor and the duration of the interrogation interval.

A further advantage of the invention is that, after a call-in of a measured value, the point in time of the most recent measuring pulse in the preceding measurement can be taken as a beginning of a new measurement. As a result thereof, a new measured value can already be calculated given the arrival of only one further measuring pulse up to the time of the next call-in of a measured value.

As a rule, the measuring pulses are processed by program routines, whereby the arriving measuring pulses are first deposited in a buffer memory. A high load on the computer then results given a high velocity and frequent call-ins of the measured value. Moreover, a memory having a high capacity would be required. In a development of the invention, problems of this type can be avoided without an impermissable deterioration of the measured values since the acquisition of measuring pulses per measuring interval is inhibited as soon as the number of measuring pulses reaches a maximum value that can be set according to the requirements, as can the frequency of the measured value call-ins.

It is especially advantageous within the framework of the invention to work with a clock counter whose counter capacity suffices in combination with the frequency of the clock pulses to cover the greatest possible time between two clock pulses at the lowest velocity. This allows one to operate without an overflow counter. For this purpose, the difference between the counter reading of the clock counter and the stored initial value is monitored and a new interrogation interval is initialized when this difference reaches a limit value that is dependent on the counter capacity; this limit value will be essentially established by the capacity of the clock counter.

DESCRIPTION OF THE PREFERRED EMBODIMENTS

Figure 1:
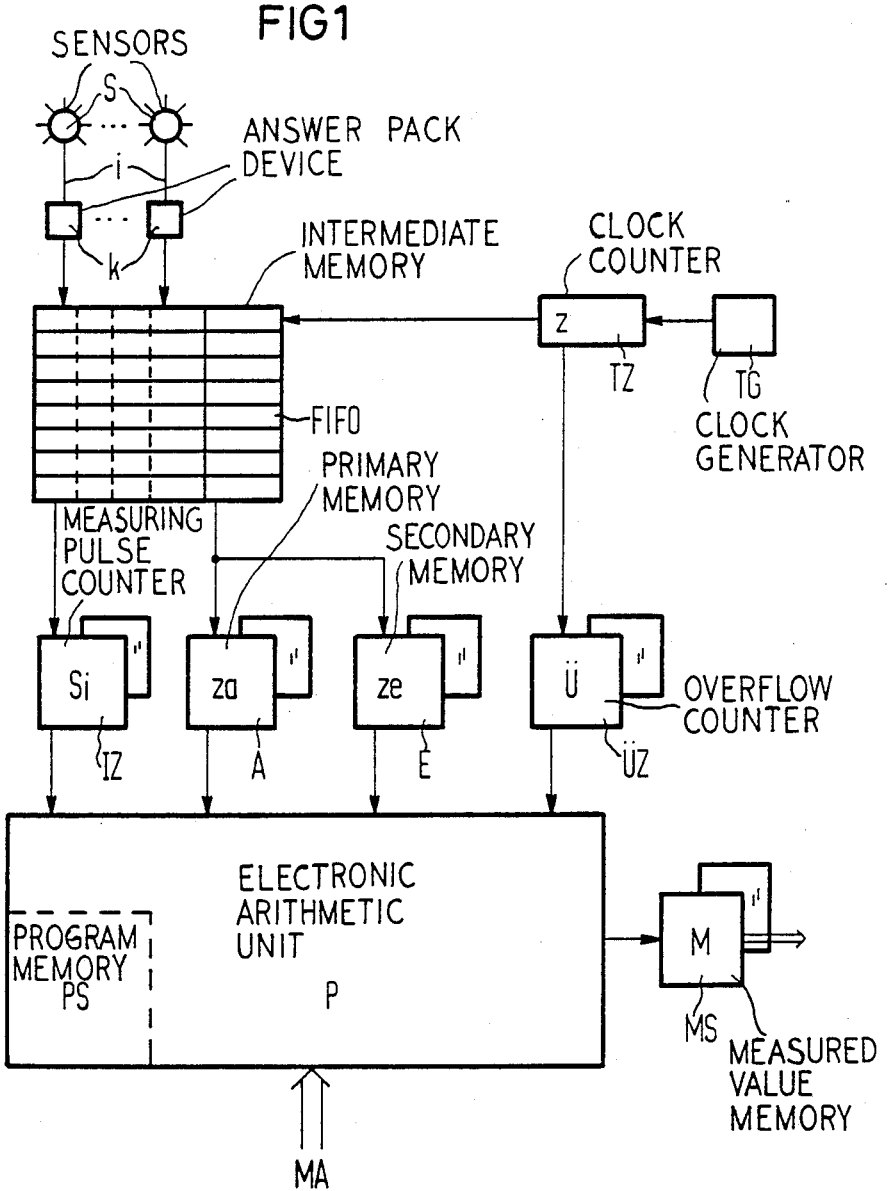
FIG. 1 is a block diagram of an apparatus for implementation of a method according to the invention.

The arrangement of FIG. 1 is suitable for the calculation of the speed of all four wheels of a vehicle. It is comprised of: an electronic arithmetic unit P and additionally contains a program memory PS for a program for the implementation of the method of the invention, a clock generator TG, and a clock counter TZ that counts the clock pulses thereof. For every wheel the following are also provided: a measuring pulse counter IZ, a primary memory A for the initial value za, a secondary memory E for the final value ze, an overflow counter ÜZ for overflows of the clock counter TZ, and a measured value memory MS for the measured values M. The counters and memories that are ultimately present and allocated to the individual wheels are illustrated by boxes following one another in FIG. 1. Arrows therein merely indicate the flow direction of the information. Control instruction lines output by the arithmetic unit to the counters and memories are not shown.

Every wheel has a sensor S allocated to it that generates measuring pulses i given a movement of the wheel, whereby the time interval between two measuring pulses corresponds to a path interval ds. An answerback device K that converts every measuring pulse i into an identification number for the identification of the wheel from which the pulse derives is allocated to every sensor S. At the moment the measuring pulse i appears, this identification number is written into an intermediate memory FIFO together with the counter reading z of the clock counter TZ. Every measured pulse i from one of the four wheels thus produces an entry in the intermediate memory FIFO, this entry being formed of an identification number and momentary counter reading z. Given the simultaneous appearance of the measuring pulses from a plurality of wheels, the identification numbers of all wheels involved can be entered into the intermediate memory FIFO together with the counter reading z of the clock counter TZ. When a separate intermediate memory is provided for every wheel, then wheel-associated identification numbers are not required.

These entries are handled in succession by an auxiliary program that is started by every measuring pulse (insofar as it is not already or still running). Every entry causes incrementation of the measuring pulse sum Si by the value 1 at the measuring pulse counter IZ identified by the identification number. Dependent on the size of the measuring pulse sum Si, the corresponding counter reading z is simultaneously written into the primary memory A as an initial value za given Si=1, or into the secondary memory E of the respective wheel as a final value given Si greater than 1. If required, overflows Ü of the clock counter are counted in an overflow counter ÜZ separately for every wheel, beginning with the respective initial value za.

With a main program that is started by an externally arriving measured value call-in MA, the arithmetic unit P calculates a new measured value Mneu from the data contained for each wheel in the counters IZ and ÜZ, as well as in the memories A and E. Unit P deposits this measured value Mneu in the measured value memory MS and simultaneously outputs it via an output channel.

Optionally, every measured value call-in MA can cause the output of a respective measured value M for all wheels; alternatively, the measured value of only one wheel can be output per measured value call-in, wherein the measured values of the individual wheels are cyclically called in. Calculating and memory capacity can be saved in this way when the measured values are not rapidly required. Details of the method of the invention shall be set forth below for a single wheel.

The measuring pulses i coming from a motion sensor S arranged at the wheel are counted in the measuring pulse counter IZ, whereby a defined path interval ds (distance or rotational angle) corresponds to every time interval lying between two measuring pulses i that follow in succession. For calculating a measured value, the number of path intervals ds and of clock pulses in a measured interval MI is therefore to be identified, this measuring interval MI lying within an interrogation interval AI and being limited by the first and by the last measuring pulse in the interrogation interval. Every interrogation interval AI begins with an initialization instruction or with the following measuring pulse, or with the last measuring pulse in the preceding interrogation interval, and ends with the next measured value call-in MA. A free wheeling clock counter TZ having a prescribed mantissa (clock counter capacity C) is used for identifying the duration of the measuring interval MI, this clock counter TZ continuously counting constant-frequency clock pulses generated by a clock generator TG whose sum (clock pulse sum St) between the first and the last measuring pulse in the interrogation interval AI is a measure for the duration of the measuring interval MI. When the clock counter TZ has reached its maximum reading, then it overflows at the next clock pulse and begins to count anew with zero.

The clock pulse sum St is calculated by forming the difference zd between the final value ze and the initial value za (operational-sign-free arithmetic modulo clock counter capacity). This assumes that the plurality of clock pulses between the arrival of two successive measuring pulses is less than the clock counter capacity z. Otherwise, the clock counter capacity z must be added to the difference zd for every overflow. What is understood by clock counter capacity z is the maximum plurality of different clock counter statuses. For an n-place binary counter, this amounts to $z=2^n$.

This counting method is particularly advantageous in the measurement of wheel speeds of all wheels of a vehicle since only a single clock counter is needed for determining the lengths of the measuring intervals of all four wheels.

Figure 2:
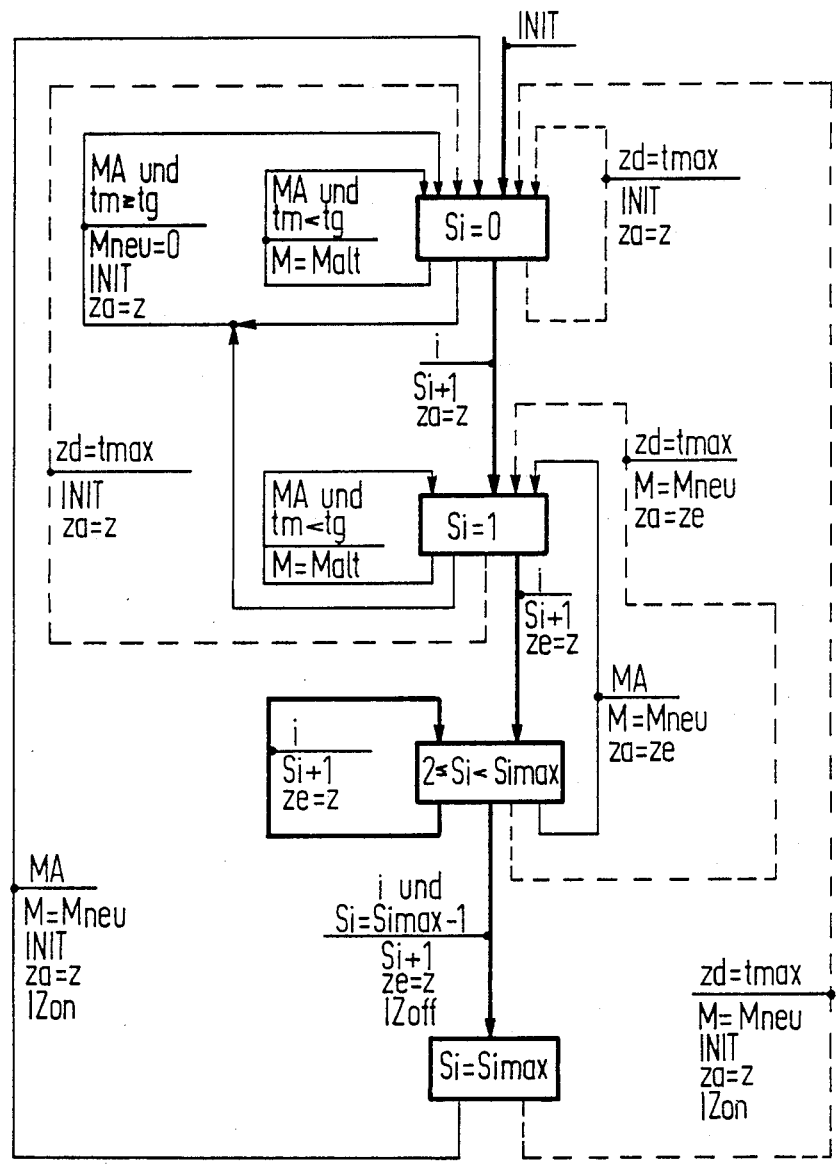
FIG. 2 is a status diagram for explaining the method of the invention.

The status or flow chart diagram shown in FIG. 2 was selected for illustrating the procedure or flow sequence of the invention. The determining factor for the procedure sequence is the measuring pulse sum Si registered in the measuring pulse counter IZ since the beginning of an interrogation interval AI. These measuring pulse sums Si are entered in boxes in FIG. 2. They can be influenced by three different kinds of events:

1. By arriving measuring pulses 1, illustrated with thick arrows;
2. By measured value call-ins MA, illustrated with thin arrows; and
3. By transgressions of the measuring time, illustrated with broken-line arrows.

Every arrow is provided with a legend that indicates the event above a horizontal bar and indicates the method steps being executed in response thereto therebelow.

The beginning of a measurement of a new interrogation interval AI occurs either on the basis of a restart of the measurement (initialization instruction INIT) or by accepting the final value ze of the immediately preceding measurement as an initial value za for the new measurement.

A new measurement is begun in status 2 which is less than or equal to Si which in turn is less than Simax by accepting the final value ze as an initial value za. Simultaneously, the measuring pulse counter IZ is set to the value 1. In all other instances, a new measurement is begun with an initialization instruction (INIT).

The measuring pulse counter IZ is thus set to the value zero and the current counter reading z of the clock counter TZ is stored as an initial value za. The pulse counter IZ is released for counting measuring pulses i (IZon).

The measuring pulse sum Si is incremented to the value 1 with the arrival of the first measuring pulse i, and the current counter reading z is stored as the initial value za.

The measuring pulse sum is incremented to Si=2 with the arrival of the next measuring pulse i and the momentary counter reading z is written into the secondary memory E as final value ze. The corresponding counter reading z is stored as a new final value ze with every further measuring pulse i, and the measuring pulse sum Si is incremented by 1. This procedure is repeated at every further measuring pulse i until either a measured value call-in MA occurs, the interrogation interval ends, or the measuring pulse sum Si reaches a maximum value Simax at which the counter reading d is registered in the secondary memory E as final value ze and the measuring pulse counter cap iz is simultaneously inhibited (IZoff) for further measuring pulses i. The measuring pulse counter IZ remains in this condition until either a measured value call-in MA occurs or the difference zd between counter reading z and initial value za has reached a maximum value tmax. The maximum measuring pulse sum Simax is reached when neither a measured value call-in MA nor a transgression of the maximum value tmax has occurred.

Measured value call-ins MA can arrive at any time. As soon as at least two measuring pulses are measured in the pulse counter IZ, the calculation of a new measured value Mneu is possible without further ado from the measuring pulse sum Si and from the stored initial value za as well as the stored final value ze.

When, however, no measuring pulse or only one measuring pulse is registered in the measuring pulse counter IZ (Si to 0 or 1), then a decision is made whether an extremely low speed (0) is present or whether the previous duration tm of the interrogation interval AI was too short. For this purpose, a limit interval GI is prescribed whose duration tg is just equal to the chronological spacing of two measuring pulses at a speed whose value is still to be displayed and below which a stand-still condition of the wheel can be assumed. This limit speed, for example, amounts to 3 km/h. The measured value "0" is output at lower speeds.

When a measured value call-in MA occurs given a measuring pulse sum Si equal to 0 or 1, and when the duration tm of the interrogation interval AI is longer than or equal to the duration tg of the limit interval GI, then the speed lies below the prescribed limit value, and the measured value M=0 is output. A new interrogation interval AI subsequently begins with the initialization instruction INIT, and Si is set to zero. Dependent on the application, the limit speed can also be output instead of the speed "0".

When, given a measured value call-in MA and a measuring pulse sum Si equal to 0 or 1, the duration tm of the interrogation interval AI is shorter than the duration tg of the limit interval GI, then it would be possible that at least a second pulse i would still be registered within this limit interval, i.e. that a speed differing from zero is present. For this reason, the measuring procedure is continued (za remains unmodified) and the old measured value Malt stored in the memory MS is output in the interim. Alternatively, an estimate of the speed can also be undertaken here, whereby a measured value is calculated as though measuring pulses have appeared at the point of the beginning of the measurement and at the point of the measured value call-in. The actual speed is then lower than this calculated value.

When a measured value call-in MA occurs given a measuring pulse sum Si greater than 1 and lower than Simax, then a measured value Mneu can be calculated from the stored data, and can be stored and output. The last measuring pulse of the measuring interval MI thus ended is then considered as the first measuring pulse of the next interrogation interval AI and of the next measuring interval MI that follows. The corresponding counter reading ze is then stored as new value za and Si is set to 1.

Finally, when a measured value call-in MA occurs given a measuring pulse sum Simax, then a new measured value Mneu is likewise calculated from the stored data, is stored and output, and a new interrogation interval AI is subsequently started with the instruction INIT. Moreover, the measuring pulse counter is set to zero and is enabled (IZ on) for a renewed registration of measuring pulses i.

It is especially advantageous to employ a clock counter having adequate capacity Z since the formation of the difference then becomes especially simple and an overflow counter does not have to be interrogated. However, it must then be assured that the difference zd between the counter reading z and the initial value za of the ongoing interrogation interval does not exceed a limit value tmax determined by the capacity Z of the clock counter. When, therefore, the difference zd corresponds to the limit value tmax and no measured value call-in is present, then, as shown in FIG. 2 with broken-line arrows, different procedure steps are initiated dependent on the measuring pulse sum Si. When the measuring pulse sum Si is equal to 0 or 1, then a new interrogation interval AI is started with the instruction INIT, and the measuring pulse counter IZ is set to zero.

When the measuring pulse sum Si is at least 2 and is lower than Simax, then a new measured value Mneu is calculated and stored, and the measuring pulse counter is set to 1 and a new interrogation interval AI is subsequently begun. As in the case given a measured value call-in, the last measuring pulse of the preceding interrogation interval is thus defined as a first measuring pulse of the new interrogation interval in this case.

When the measuring pulse sum Si is equal to the maximum value Simax, then a new measured value Mneu is calculated as in the case of a measured value call-in MA, and the restart of a measurement is initiated.

The monitoring of zd to determine if it is greater than tmax can be omitted when it is guaranteed that the time between two measured value call-ins MA is always shorter than or equal to tmax. A simplification of the method can be achieved in this way.

The limits of a measuring interval MI and the identification of its duration for calculating the momentary speed on the basis of the method set forth above shall be explained with reference to a simple example wherein a four-place binary counter is employed as clock counter TZ. All flows at the clock counter shall not be taken into consideration at first, i.e. the length tm of an interrogation interval AI must be shorter than the clock counter capacity Z.

Figure 3:
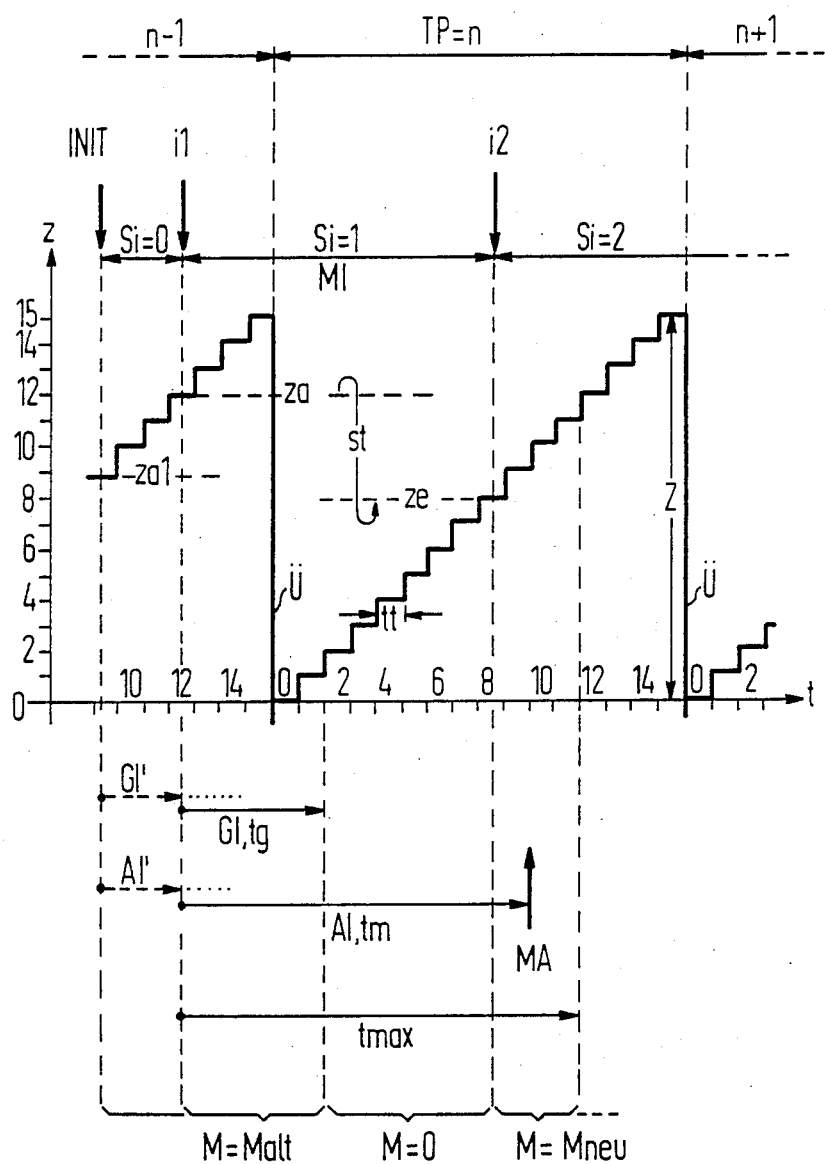
FIG. 3 is a diagram for explaining the calculation of a measured value.

In the diagram shown in FIG. 3, the clock counter reading z is entered on the ordinate and the time t is entered on the abscissa.

As a four-place binary counter, the clock counter TZ can assume 16 different values, namely the values 0 through 15 (equals clock counter capacity Z). A counting of the clock counter from 0 through 15 is referred to as a clock counter period TP. A full clock counter period TP=n is shown in FIG. 3, as is the last part of the preceding clock counter period TP=n−1 and the first part of the following clock counter period TP=n+1. This yields continuous, sawtooth-like stepped curves.

The equations recited below for calculating the duration St of the measuring interval MI relate to digital computation.

With the rule that no overflows Ü are counted, the maximum duration tmax of an interrogation interval AI, and thus of a measuring interval MI, may be at most $2^n - 1 = 15$ clocks long. If it were longer, the calculation could deliver an incorrect result.

It is thus irrelevant which clock counter reading z is stored as an initial counter reading za. The only thing important is that the final counter reading ze lies no more than 15 clocks after za. When ze is higher than za, then za is simply subtracted from ze: St=ze−za. When, however, za is higher than ze, then the complementary value $za^* = 2^n - za$ zu ze is added to ze: $St = za^* + ze$.

If the duration of an interrogation interval AI is to be longer than $2^n - 1$ clocks, then the overflows Ü of the clock counter TZ must be counted in an overflow counter ÜZ. Then the following is valid:
$St = ze - za + 2^n \cdot \ddot{U}$, when ze is greater than za,
Also, the following is valid:
$St = za^* + ze + 2^n (\ddot{U} - 1)$, when ze is lower than za.

When an interrogation interval AI identified by the instruction INIT in FIG. 3 begins at point in time 9(n−1) (to be read as at the clock counter reading 9 of the clock period n−1), then the clock counter reading 9 is read into the memory A as initial value zal. At this time, the measuring pulse sum amounts to Si=0. When a measuring pulse il appears at times 12(n−1), then the counter reading za=12 is transferred into the memory A instead of the stored value zal. Beginning with this point in time, the measuring pulse sum amounts to Si=1. When a second measuring pulse i2 arrives at time 8(n), then the measuring pulse sum from this time forward amounts to Si=2. The clock counter reading z=8 is written into the memory E as final value ze. The duration St of the measuring interval I at this moment amounts to $St = (16 - 12) + 8 = 12$.

The limit interval GI' or respectively GI, and the interrogation interval AI' or respectively AI, each begin at the initial value za residing in the memory A. In the diagram in FIG. 3, the duration tg of the limit interval GI is indicated as 5 clocks and the maximum duration tmax is indicated at 15 clocks. Dependent upon whether and at what time a measured value call-in MA occurs, either the value Malt stored in the measured value memory MS, the value M=0, or the value M=Mneu is output as measured value M. The ranges are identified in FIG. 3, at the bottom, with curved brackets.

A new measured value per interrogation interval is calculated according to the equation:

$$Mneu = \frac{(Si - 1) \cdot ds}{St \cdot tt} \cdot C$$

whereby ds denotes a path or rotational angle interval covered by the sensor/wheel between two successive measuring pulses i (between two sensor teeth), tt denotes the time between two clock pulses, and C denotes a constant.

According to the status diagram in FIG. 2, new measured values are continuously calculated in this fashion.

Although various minor changes and modifications might be proposed by those skilled in the art, it will be understood that we wish to include within the claims of the patent warranted hereon all such changes and modifications as reasonably come within our contribution to the art.

We claim as our invention:

1. A method for identifying and interrogating a measured value M of velocity of speed of an object, comprising the steps of:
   providing a sensor that generates a respective measuring pulse when the object moves through a path interval of a fixed size;
   providing a clock generator for generating clock pulses having a constant clock frequency, and providing a clock counter connected to the clock generator;
   calculating a sum of the measuring pulses as a measuring pulse sum Si in a measuring interval that is limited by a first and by a last measuring pulse;
   calculating a sum of the clock pulses as a clock pulse sum St during said measuring interval;
   calculating a new value of measured value M for each measuring interval from said measuring pulse sum Si and said clock pulse sum St;
   providing initialization instructions;
   upon arrival of every measuring pulse and at every initialization instruction reading a counter reading z of said clock counter and allocating it to a respective triggering event;
   storing a counter reading z allocated to the initialization instruction and to a first, following measuring pulse as an initial value za, said initial value za being an initial value of a measuring interval and of an interrogation interval that begins therewith;
   storing a counter reading z allocated to every following measuring pulse as a final value ze, whereby every new counter reading overwrites a preceding counter reading; and
   for a measured value call-in
   ending the measuring interval with a last measuring pulse,
   using a difference between the final value ze and the initial value za as said clock pulse sum St, and
   storing the final value ze as a new initial value za if the measuring pulse sum Si is greater than 1 and less than a maximum value Simax.

2. A method according to claim 1 wherein circumferential speed or velocity of a vehicle wheel is being measured.

3. A method according to claim 1 including the steps of:

provisionally ending the interrogation interval with a measured value call-in, and comparing a duration tm of the interrogation interval to a duration tg of a limit interval when fewer than two measuring pulses lie in the interrogation interval where Si is less than 2;

given a duration tm of the previously ended interrogation interval shorter than the duration tg of the limit value interval, outputting as a new value Mneu either a most recently output measured value Malt or an estimated value that is calculated as though measuring pulses had appeared at a time of a measuring start and of the measured value call-in, and then continuing the interrogation interval; and given a duration of the provisionally ended interrogation interval that is at least equal to the duration tg of the limit interval, outputting a new value 0 as the measured value, giving a new initialization instruction, and setting the measuring pulse sum Si to zero.

4. A method according to claim 1 including the step of inhibiting acquisition of measuring pulses as soon as the measuring pulse sum Si reaches the maximum value Simax.

5. A method according to claim 4 wherein, given a measured value call-in after inhibiting the acquisition, calculating and outputting as a measured value a new value based on the stored data for a final value ze and an initial value za;

starting a new interrogation interval by an initialization instruction setting the measuring pulse sum Si to zero; and cancelling the inhibiting of the acquisition of measuring pulses.

6. A method according to claim 1 wherein said clock counter has a counter capacity Z, and given employment of the clock counter without the overflow counter, monitoring a difference zd between the counter reading z of the clock counter and the initial value za and, when this difference reaches a limit value tmax that is dependent on the counter capacity Z of the clock counter either storing the new value zero as a measured value setting the measuring pulse sum Si to zero, and giving an initialization instruction when the measuring pulse sum Si was less than 2;

or calculating a new value Mneu as a measured value based on the initial value za, storing the final value ze, setting the measuring pulse sum Si to 1, and storing the final value ze as a new initial value za if the measuring pulse sum Si was equal to or greater than 2 and less than Simax;

or calculating and storing a new value Mneu as a measured value based on the initial value za and the final value ze, setting the measuring pulse sum Si to zero, and giving an initialization instruction when the measuring pulse sum Si was equal to Simax; and subsequently beginning a new interrogation interval.

7. An apparatus for identifying and interrogating a measured value M of velocity or speed of an object, comprising:

sensor means for generating a respective measuring pulse when the object moves through a path interval of a fixed size;

clock generator means for generating clock pulses having a constant clock frequency;

a clock counter means connected to the clock generator means;

means for calculating a sum of the measuring pulses as a measuring pulse sum Si in a measuring interval that is limited by a first and by a last measuring pulse;

means for calculating a sum of the clock pulses as a clock pulse sum St during said measuring interval;

means for calculating a new value of measured value M for each measuring interval from said measuring pulse sum Si and said clock pulse sum St;

means for providing initialization instructions;

means for reading a counter reading z of said clock counter means and allocating it to a respective triggering event upon arrival of every measuring pulse and at every initialization instruction;

means for storing a counter reading z allocated to the initialization instruction and to a first, following measuring pulse as an initial value za, said initial value za being an initial value of a measuring interval and of an interrogation interval that begins therewith;

means for storing the counter reading z allocated to every following measuring pulse as a final value ze, whereby every new counter reading overrides a preceding counter reading; and means for a measured value call-in means ending the measured interval with a last measuring pulse, using a difference between the final value ze and the initial value za as said clock pulse St, and for storing the final value ze as a new initial value za if the measuring pulse sum Si is greater than 1 and less than a maximum value Simax.

8. An apparatus according to claim 7 including:

a measuring pulse counter means for measuring pulses coming from the sensor means;

said clock generator means generating clock pulses having a constant frequency;

said clock counter means counting said clock pulses;

a primary memory means for storing said initial value za of a clock counter reading allocated to a measuring start of the interrogation interval or to the first measuring pulse;

a secondary memory means for storing the final value ze of the clock counter reading allocated to the last measuring pulse;

a measured value memory means for storing the measured value M; and a program memory means for storing a program.

9. An apparatus according to claim 8 wherein an intermediate memory means is provided for intermediately storing an entry for each measuring pulse, said entry containing the counter reading z of the clock counter means at the arrival of a measuring pulse, and an identifier for allocating the measuring pulse to a specific sensor, said sensor means comprising a plurality of specific sensors.

10. An apparatus according to claim 9 wherein a means is provided for storing measuring pulses from each of the sensors in intermediate fashion along with a corresponding counter reading z of the clock counter means and corresponding identifiers for identifying each of the sensors allocated to the measuring pulses.

11. An apparatus according to claim 9 wherein a plurality of intermediate memory means are provided, each intermediate memory means being allocated to each sensor, and each intermediate memory means intermediately storing for each measuring pulse a corresponding counter reading z of the clock counter at arrival of the measuring pulse.

* * * * *